(12) United States Patent
Shima et al.

(10) Patent No.: US 10,199,253 B2
(45) Date of Patent: Feb. 5, 2019

(54) METHOD FOR MANUFACTURING SEMICONDUCTOR DEVICES THROUGH PEELING USING UV-RAY

(71) Applicant: Toshiba Memory Corporation, Tokyo (JP)

(72) Inventors: Masaya Shima, Oita Oita (JP); Kenji Takahashi, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/636,166

(22) Filed: Mar. 2, 2015

(65) Prior Publication Data

US 2016/0079109 A1    Mar. 17, 2016

(30) Foreign Application Priority Data

Sep. 16, 2014    (JP) .................. 2014-187677

(51) Int. Cl.
*H01L 21/683*    (2006.01)
*H01L 21/78*    (2006.01)
(Continued)

(52) U.S. Cl.
CPC .......... *H01L 21/6835* (2013.01); *B23K 26/00* (2013.01); *H01L 21/67115* (2013.01);
(Continued)

(58) Field of Classification Search
CPC .................................................. H01L 21/6836
(Continued)

(56) References Cited

U.S. PATENT DOCUMENTS 7,335,578 B2    2/2008    Fukuoka et al.
7,410,908 B2    8/2008    Hara
(Continued)

FOREIGN PATENT DOCUMENTS

CN    1592953 A    3/2005
CN    100405554    7/2008
(Continued)

OTHER PUBLICATIONS

TW Office Action dated Aug. 29, 2016 for Application No. 104106907.
(Continued)

*Primary Examiner* — Hsin-Yi Hsieh
(74) *Attorney, Agent, or Firm* — Patterson & Sheridan, LLP

(57) ABSTRACT

A method of manufacturing a semiconductor device includes disposing a peel-off layer on the second surface of the first substrate, wherein the second surface of the first substrate comprises semiconductor integrated circuits, and the peel-off layer does not extend to an outer peripheral portion of the first substrate, bonding a second substrate to the peel-off layer via a bonding layer, attaching a tape onto the first surface of the first substrate, wherein the tape comprises an adhesive agent having an adhesive strength capable of being lowered by UV irradiation, irradiating a portion of the adhesive agent provided at the outer peripheral portion with UV rays directed toward the first surface, and separating the first substrate from the second substrate at the adhesive agent portion and the peel-off layer portion.

10 Claims, 10 Drawing Sheets

(51) Int. Cl.
*B23K 26/00* (2014.01)
*H01L 21/67* (2006.01)
*B32B 43/00* (2006.01)

(52) U.S. Cl.
CPC .......... *H01L 21/6836* (2013.01); *H01L 21/78* (2013.01); *B32B 43/006* (2013.01); *B32B 2310/0831* (2013.01); *B32B 2310/0843* (2013.01); *B32B 2457/14* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(58) Field of Classification Search
USPC .......................................................... 438/464
See application file for complete search history.

(56) References Cited

U.S. PATENT DOCUMENTS

| | | | |
|---|---|---|---|
| 2005/0196901 A1* | 9/2005 | Suzuki | H01L 21/563 438/114 |
| 2006/0276006 A1* | 12/2006 | Yang | H01L 21/78 438/455 |
| 2013/0248099 A1 | 9/2013 | Shimizu et al. | |
| 2013/0280886 A1 | 10/2013 | Kato et al. | |
| 2013/0299946 A1* | 11/2013 | Takahashi | H01L 21/02 257/618 |

FOREIGN PATENT DOCUMENTS

| | | |
|---|---|---|
| CN | 103302572 A | 9/2013 |
| JP | 2005150453 A | 6/2005 |
| JP | 2005252072 A | 9/2005 |
| JP | 2007048876 A | 2/2007 |
| JP | 2012079836 A | 4/2012 |
| JP | 2013-201251 A | 10/2013 |
| JP | 2013235919 A | 11/2013 |
| JP | 2013239595 A | 11/2013 |
| TW | 201120171 A | 6/2011 |
| TW | 201415583 A | 4/2014 |

OTHER PUBLICATIONS

Japanese Office Action dated May 9, 2017, filed in Japanese counterpart Application No. 2014-187677, 5 pages (with translation).

Chinese Office Action dated Mar. 19, 2013, filed in Chinese counterpart Application No. 201510098261.6, 13 pages (with translation).

Japanese Office Action dated Nov. 21, 2017, filed in Japanese counterpart Application No. 2014-187677, 8 pages (with translation).

* cited by examiner

METHOD FOR MANUFACTURING SEMICONDUCTOR DEVICES THROUGH PEELING USING UV-RAY

CROSS-REFERENCE TO RELATED APPLICATION

This application is based upon and claims the benefit of priority from Japanese Patent Application No. 2014-187677, filed Sep. 16, 2014, the entire contents of which are incorporated herein by reference.

FIELD

Embodiments described herein relate generally to a method and apparatus for manufacturing a semiconductor device.

BACKGROUND

A semiconductor device, such as a semiconductor device having a through silicon via (TSV) structure, is manufactured by several distinct processes such as via formation, wiring formation, insulating layer formation, and bump formation, after a thinning process. A support substrate may be used to handle and transport a semiconductor substrate between processes. To facilitate handling and transport, the semiconductor substrate may be bonded to a support substrate with an adhesive material. After processing, the semiconductor substrate must be separated from the support substrate.

The semiconductor substrate is bonded to the support substrate by an adhesive material which may reliably peel away to separate the semiconductor substrate from the support substrate after the processes. Such an adhesive material may comprise, for example, a structure of two or more layers including an adhesion layer having an adhesive function and a peel-off layer having a peel-away function.

It is desirable to prevent position deviation during processing while the semiconductor substrate is bonded to the support substrate. Therefore, in a peripheral portion of the semiconductor substrate, the peel-off layer is not formed and the adhesion layer directly contacts the semiconductor substrate. After processing, when the semiconductor substrate is peeled away from the support substrate, the portion where the adhesion layer directly contacts the semiconductor substrate may inhibit the separation. This adhesion layer may be removed by, for example, dissolving the adhesion layer with a liquid solvent or directly removing the adhesion layer with a blade or the like.

The liquid solvent used during semiconductor processing may dissolve or swell the adhesion layer, causing detachment of the semiconductor substrate during processing. Use of an adhesion layer having a tolerance to the liquid solvent used in during semiconductor processing may also result in a lower dissolution rate of the adhesion layer for separation purposes, lowering productivity. Direct removal with a blade or similar tool may reduce an effective area of the peripheral portion of the semiconductor substrate, also lowering productivity.

DETAILED DESCRIPTION

The embodiments described herein provide a semiconductor manufacturing method and apparatus that facilitate separation of a first substrate from a second substrate.

In general, according to one embodiment, a method of manufacturing a semiconductor device includes disposing a peel-off layer on the second surface of the first substrate, wherein the second surface of the first substrate comprises semiconductor integrated circuits, and the peel-off layer does not extend to an outer peripheral portion of the first substrate, bonding a second substrate to the peel-off layer via a bonding layer, attaching a tape onto the first surface of the first substrate, wherein the tape comprises an adhesive agent having an adhesive strength capable of being lowered by UV irradiation, irradiating a portion of the adhesive agent provided at the outer peripheral portion with UV rays directed toward the first surface, and separating the first substrate from the second substrate at the adhesive agent portion and the peel-off layer portion.

Hereinafter, a plurality of embodiments will be described with reference to the drawings. The drawings are schematic diagrams, and a relationship between a thickness and a planar dimension, a ratio of the thickness of each layer, and the like do not necessarily agree with real values. A vertical direction and a horizontal direction indicate the relative directions of a case with respect to surfaces on which circuits are formed, and do not necessarily indicate a reference to a direction of gravitational acceleration.

(First Embodiment)

FIG. 1A to FIG. 6B illustrate a first embodiment. Hereinafter, the processes will be described with respect to a semiconductor substrate 1, which may be processed by, for example, grinding and through silicon via (TSV) formation.

Figure 1A:
FIG. 1A, FIG. 1B and FIG. 1C are schematic cross-sectional views of a detail of a semiconductor substrate at steps of a manufacturing process.
Figure 1B:
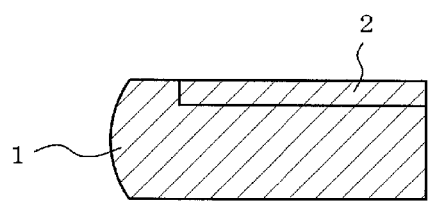
Figure 1C:
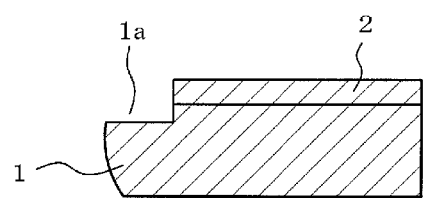

FIG. 1A illustrates a cross-section of an outer peripheral portion of the semiconductor substrate 1, such as a silicon substrate. As illustrated in FIG. 1B, a semiconductor manufacturing process results in formation of a device portion 2 in a portion other than the outer peripheral portion of a second surface of the semiconductor substrate 1. The device portion 2 may include a plurality of chips having a semiconductor integrated circuit which includes a semiconductor device. After forming the semiconductor integrated circuit into the device portion 2 of the semiconductor substrate 1, a grinding process (edge trimming process) is performed on the outer peripheral portion of the second surface of the semiconductor substrate 1. As a result, as illustrated in FIG. 1C, a step portion 1a is formed in the outer peripheral portion of second surface of the semiconductor substrate 1, and the device portion 2 remains intact on the second surface of the semiconductor substrate 1. A grinding depth of the step portion 1a of the semiconductor substrate 1 may be within a range of 200 µm to 300 µm, for example.

Figure 2A:
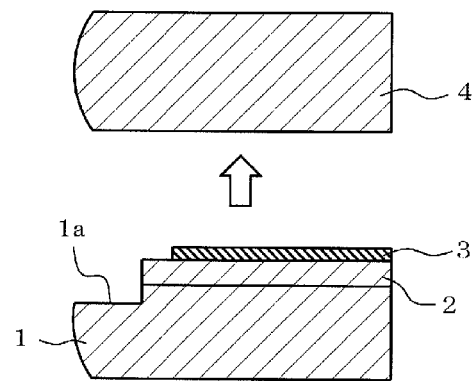
FIG. 2A, FIG. 2B and FIG. 2C are schematic cross-sectional views of a detail of the semiconductor substrate at steps of the manufacturing process.

In FIG. 2A, a peel-off layer 3 is provided on the device portion 2 of the semiconductor substrate 1. Peel-off layer 3 has a weak adhesive force and may be, for example, a material such as thermoplastic resin for which limited stress may cause shear rupture. The peel-off layer 3 is formed over most of the device portion 2, but the peel-off layer 3 is not formed over the outer edge of the device portion 2. The result is an approximate ring shape in the outermost peripheral portion of the device portion 2 over which the peel-off layer 3 is not formed. The non-formation portion may have a width in the range of 0.1 mm to 5 mm.

Figure 2B:
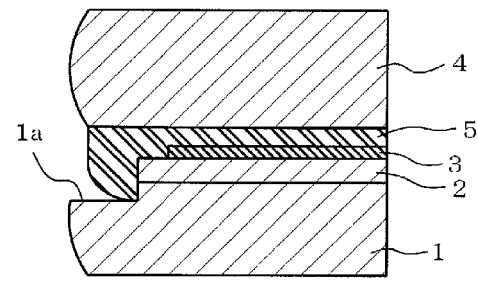

In FIG. 2B, an adhesion layer 5 attaches the semiconductor substrate 1, on which the peel-off layer 3 is formed, to a support substrate 4.

There is a risk of position deviation, which may cause cracking of the semiconductor substrate 1. To minimize this risk, the support substrate 4 has an outer diameter dimension approximately 0.1 mm to 1 mm greater than an outer dimension of the semiconductor substrate 1.

The support substrate 4 may have a thickness in the range of 600 µm to 800 µm. When the process is completed, the surface of the separated support substrate may be ground for potential reuse. The support substrate 4 may comprise, for example, a silicon substrate. If the semiconductor substrate 1 also comprises a silicon substrate, the semiconductor substrate 1 may be less likely to distort in response to thermal stress. Alternatively, the support substrate 4 may comprise, for example, a glass plate or the like.

The adhesion layer 5 may have a thickness in the range of 1 µm to 100 µm. The peel-off layer 3 is thick enough to allow the support substrate 4 to peel away, and is thin enough to prevent the position deviation of the semiconductor substrate 1 while it is bonded. For example, the thickness of the peel-off layer 3 may be in the range of 0.01 µm to 20 µm. The adhesion layer 5 is provided so as to cover an inside portion of the step portion 1a in the outer peripheral portion of the semiconductor substrate 1. The degree of adhesion between the peel-off layer 3 and the adhesion layer 5, or the degree of adhesion between the peel-off layer 3 and the semiconductor substrate 1, is adjusted to be less than the degree of adhesion between the adhesion layer 5 and the support substrate 4. The peel-off layer 3 may comprise a material which facilitates separation of the support substrate 4 by interfacial peeling between the layers.

Figure 2C:
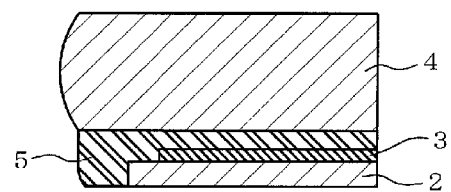

As illustrated in FIG. 2C, while the semiconductor substrate 1 is bonded to the support substrate 4, a process may be performed on the semiconductor substrate 1. First, for example, the thickness of the semiconductor substrate 1 is processed by grinding to be 50 µm or less. As a result, the step portion 1a, which was formed in the outer peripheral portion of the semiconductor substrate 1, disappears, the outermost peripheral portion of the semiconductor substrate 1 disappears, and the device portion 2 remains. After the grinding process, other processes may be performed on the device portion 2 of the semiconductor substrate 1. For example, a through electrode (TSV) may be formed that penetrates from the first surface to the second surface, or an electrode pad of the through electrode may be formed by a well-known method.

Figure 3A:
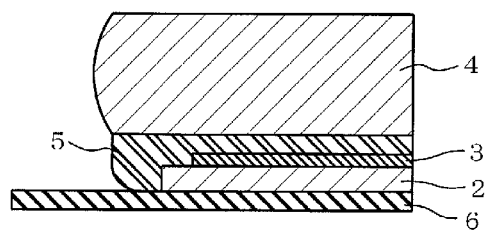
FIG. 3A is a schematic cross-sectional view of a detail of the semiconductor substrate at one step of the manufacturing process.
Figure 3B:
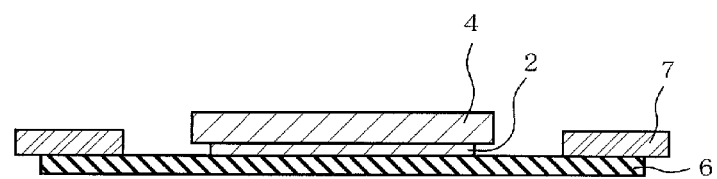
FIG. 3B is a schematic cross-sectional view of the semiconductor substrate at one step of the manufacturing process.

In FIG. 3A and FIG. 3B, a tape 6 is attached to the first surface of the device portion 2 of the semiconductor substrate 1. FIG. 3A illustrates the cross-section of the support substrate 4 and the peripheral portion of the device portion 2 of the semiconductor substrate 1. FIG. 3B is a cross-sectional view illustrating the whole of a ring frame 7. In FIG. 3B, the peel-off layer 3 and the adhesion layer 5 are not pictured.

As illustrated in FIG. 3A and FIG. 3B, the tape 6 is cut to be larger than an external dimension of the device portion 2 of the semiconductor substrate 1, and contacts the ring frame 7. The tape 6 has a layered structure of two layers or more, including an adhesive layer comprising a base material and an adhesive agent. The adhesive layer of the tape 6 has an adhesive force which may be reduced by cross-linking and curing the adhesive layer by ultraviolet rays (UV) irradiation.

Figure 4A:
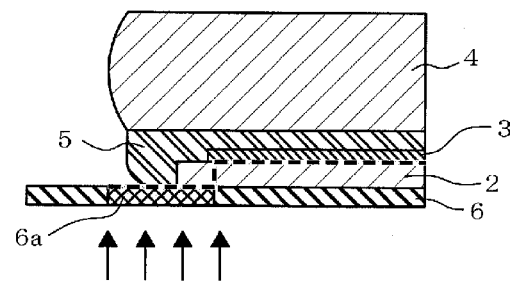
FIG. 4A is a schematic cross-sectional view of a detail of the semiconductor substrate shown at one step of the manufacturing process.
Figure 4B:
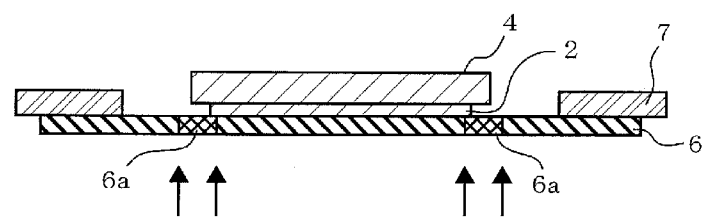
FIG. 4B is a schematic cross-sectional view of the semiconductor substrate at one step of the manufacturing process.

In FIG. 4A and FIG. 4B, a portion 6a of tape 6 is irradiated with UV light to weaken the adhesive force of tape 6. In this case, the UV-irradiated portion of the tape 6 includes at least the portion where the adhesion layer 5 directly contacts and bonds to the first surface of the device portion 2 of the semiconductor substrate 1. As a result, a cured portion 6a, which has a lower adhesive strength than the tape 6, is formed on the tape 6. The cured portion 6a has a ring shape, and as illustrated in FIG. 4A, an inner circumference of the cured portion 6a may align with the outer circumference of the peel-off layer 3, which is provided on the second surface of the device portion 2 of the semiconductor substrate 1. Alternatively, the inner circumference of the cured portion 6a may fall within the circumference of the peel-off layer 3, with an inner diameter of the cured portion 6a measuring less than a diameter of the peel-off layer 3. The outer circumference of the cured portion 6a falls outside the outer circumference of the adhesion layer 5. As discussed above, the adhesion layer 5 is positioned on the outside of the device portion 2 and directly contacts the tape 6.

Figure 6A:
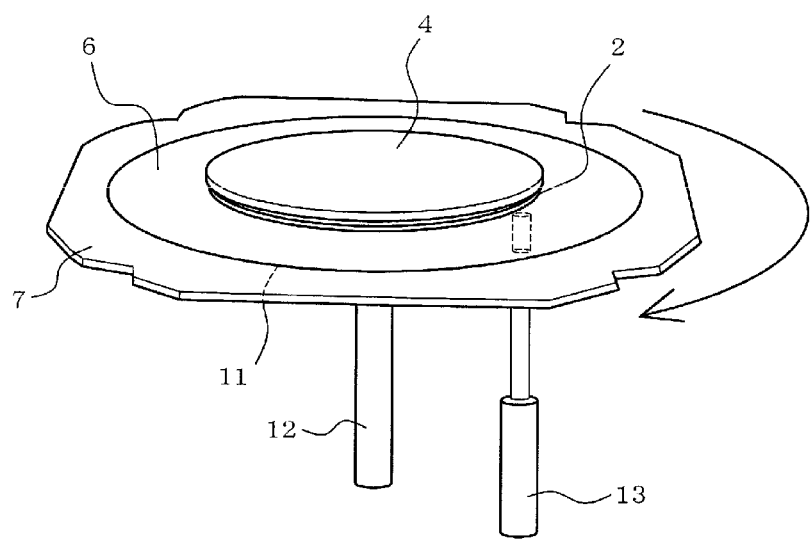
FIG. 6A is a schematic perspective view of a UV irradiation apparatus.
Figure 6B:
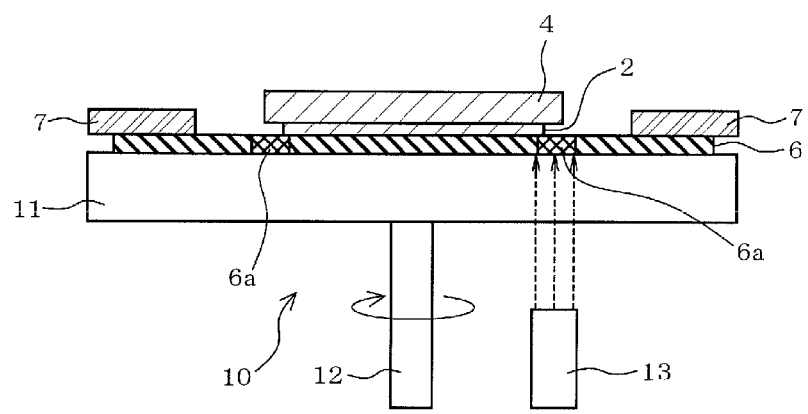
FIG. 6B is a schematic cross-sectional view of the UV irradiation apparatus.

Moreover, the UV irradiation to the tape 6 is performed using configurations illustrated in FIG. 6A and FIG. 6B.

FIG. 6A is a schematic perspective view of a UV irradiation apparatus. FIG. 6B is a schematic cross-sectional view of a UV irradiation apparatus 10. The tape 6 is bonded to the first surface of the device portion 2, which adheres to the support substrate 4 on the first surface side via the peel-off layer 3 and the adhesion layer 5. The ring frame 7 of the UV irradiation apparatus 10 retains the tape 6 while the laser source 13 irradiates the tape 6 with UV rays.

The tape 6 and the ring frame 7 are mounted on a table 11. The table 11 is a disk-shaped table which may comprise a material having light-transmitting properties such as a glass plate or an acrylic plate. The table 11 is supported in the center by a rotation axis 12. The rotation axis 12 is rotatably drivable by a motor, and thereby, the table 11 is configured to be rotatable. A laser source 13 is provided on the side of the table 11 opposite the ring 7. The laser source 13 may emit a UV laser beam. The UV laser beam may be directed toward a portion of the table 11. Because the table 11 comprises a material with light-transmitting properties, the UV laser beam may irradiate the ring frame 7 and the tape 6 which are mounted on the table 11, or the device portion 2 of the semiconductor substrate 1. The table 11 may be rotated by the rotation axis 12, and thereby, the irradiation of the UV laser beam may be performed in a circumferential direction. The laser source 13 is configured so that an irradiation width of the UV laser beam may be varied.

As a result, as illustrated in FIG. 6A, the UV laser beam irradiates the tape 6 in the vicinity of the outer edge of the device portion 2 of the semiconductor substrate 1. At the same time, the table 11 rotates such that a portion of the tape 6 at or near the outer peripheral portion of the device portion 2 of the semiconductor substrate 1 is irradiated with the UV laser beam, and the cured portion 6a of the tape 6 is formed in a ring shape. In order to form the cured portion 6a, the table 11 may be rotated by one rotation. The cured portion 6a, which features lowered adhesive strength compared to the tape 6, is indicated by cross-hatching over a portion of the tape 6 in FIGS. 4A and 4B.

Figure 5A:
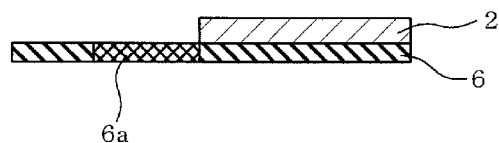
FIG. 5A is a schematic cross-sectional view of a detail of the semiconductor substrate at one step of the manufacturing process.
Figure 5B:
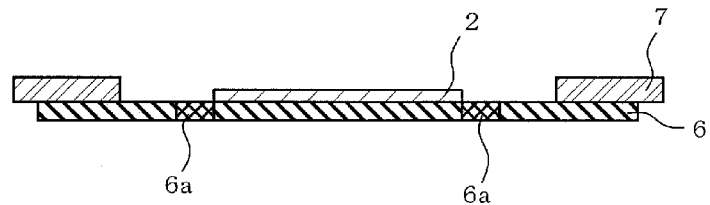
FIG. 5B is a schematic cross-sectional view of the semiconductor substrate at one step of the manufacturing process.

In FIG. 5A and FIG. 5B, the support substrate 4 is separated from the device portion 2 of the semiconductor substrate 1. The thick dashed line of FIG. 4A indicates the location of separation of the support substrate 4 from the device portion 2. The separation occurs at the thick dashed line between the cured portion 6a and the adhesion layer 5; between the cured portion 6a and the device portion 2; and between the device portion 2 and the peel-off layer 3. Where the thick dashed line shifts from the first surface side of the device portion 2 that faces the cured portion 6A to the second surface side of the device portion 2 that faces the peel-off layer 3, the device portion 2 is separated by cracking. Because the device portion 2 is thin due to the grinding described above, the device portion 2 is easily cracked at the target location while suppressing further cracking of the device portion 2.

As a result, as illustrated in FIG. 5A and FIG. 5B, the device portion 2 is separated from the support substrate 4, the adhesion layer 5, and the peel-off layer 3. The device portion 2 remains attached to the tape 6. The device portion 2 of the semiconductor substrate 1 attached onto the tape 6 is then diced into chips.

According to the first embodiment, the device portion 2 is processed while the semiconductor substrate 1 is bonded to the support substrate 4 by the adhesion layer 5. Thereafter, the tape 6 is attached and the irradiation of the UV laser beam is then performed to form the cured portion 6a on the tape 6. Thus, a portion where the device formation 2 and the adhesion layer 5 adhere to each other may be likely to peel off based on the position of the cured portion 6a.

The semiconductor manufacturing apparatus 10 provides an efficient mechanism for forming the ring-shaped cured portion 6a in the tape 6. The tape 6 is attached to the semiconductor substrate 1, which is mounted on the table 11 and retained by the ring frame 7. The table 11 comprises a material having light-transmitting properties. The semiconductor substrate 1 is irradiated with the UV laser beam from the first surface side by the laser irradiation portion while table 11 rotates. The apparatus therefore facilitates efficiently forming the ring-shaped cured portion 6a in the tape 6.

In the first embodiment, before bonding the semiconductor substrate 1 to the support substrate 4, a crystal defect portion which is likely to separate into the chips or the like may be formed along a scribe line of the device portion 2.
(Second Embodiment)

FIG. 7 to FIG. 12B illustrate a second embodiment. Hereinafter, the aspects of the second embodiment that are different from the first embodiment will be described.

Figure 7:
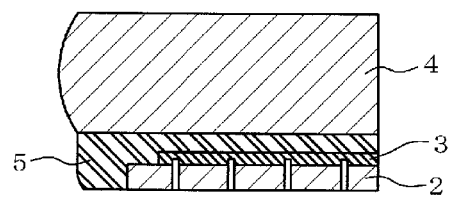
FIG. 7 is an enlarged schematic cross-sectional view shown at one step of a manufacturing process according to a second embodiment.

In the second embodiment, the semiconductor substrate 1 comprising the device portion 2 is bonded to the support substrate 4 using the peel-off layer 3 and the adhesion layer 5. The second surface of the semiconductor substrate 1 is processed in the same manner as the first embodiment. Thereafter, as illustrated in FIG. 7, the device portion 2 is diced from the second surface side before the tape 6 is attached. The dicing may completely penetrate the device portion 2 and reach the peel-off layer 3. As a result, a dicing groove 2a (pictured in FIG. 9A), having a predetermined depth, forms a lattice shape on the rear face of the device portion 2 of the semiconductor substrate 1, and the device portion 2 adheres to the peel-off layer 3 although it has been diced into chips.

Figure 8A:
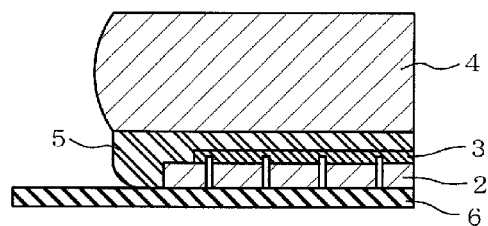
FIG. 8A is a schematic cross-sectional view of a detail of the semiconductor substrate at one step of the manufacturing process.
Figure 8B:
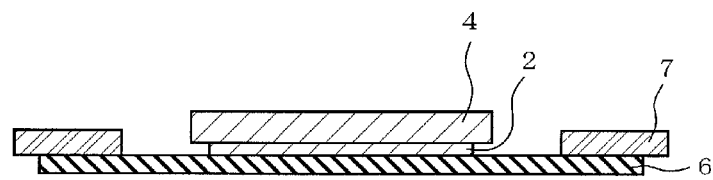
FIG. 8B is a schematic cross-sectional view of the semiconductor substrate at one step of the manufacturing process.

Subsequently, as illustrated in FIG. 8A and FIG. 8B, the tape 6 is attached to the second surface of the device portion 2. FIG. 8A shows a cross-section of the support substrate 4 and a peripheral portion of the device portion 2 of the semiconductor substrate 1. FIG. 8B is a cross-sectional view of the whole of the ring frame 7. In FIG. 8B, the peel-off layer 4 and the adhesion layer 5 are not pictured. The tape 6 may be used in the same manner as in the first embodiment. As in the first embodiment, the adhesive layer of the tape 6 has the property that the adhesive force is lowered in the case of being cross-linked and cured by the UV irradiation.

Figure 9A:
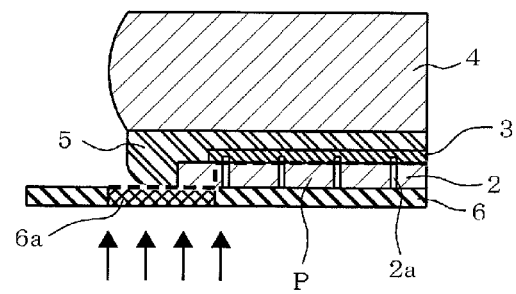
FIG. 9A is a schematic cross-sectional view of a detail of the semiconductor substrate at one step of the manufacturing process.
Figure 9B:
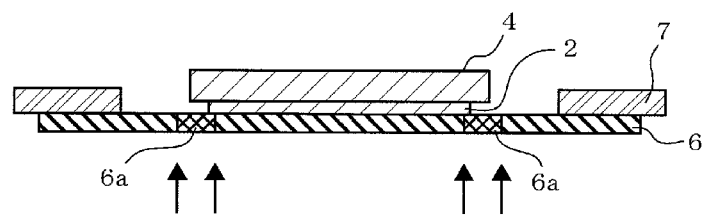
FIG. 9B is a schematic cross-sectional view of the semiconductor substrate at one step of the manufacturing process.

In FIG. 9A and FIG. 9B, a portion of the tape 6 is UV-irradiated where the adhesion layer 5 directly contacts the device portion 2 of the semiconductor substrate 1. The UV irradiation results in a cured portion 6a in the tape 6, where the cured portion 6a has a lower adhesive strength than the other areas of the tape 6. The cured portion 6a is formed in a ring shape, and as illustrated in FIG. 9A, the inner diameter of the cured portion 6a is equal to or less than the outer diameter of the peel-off layer 3, which is provided on the second surface of the device portion 2. The outer diameter of the cured portion 6a is less than the outer diameter of the adhesion layer 5, which is positioned on the outside of the device portion 2, and directly contacts the tape 6.

Figure 10A:
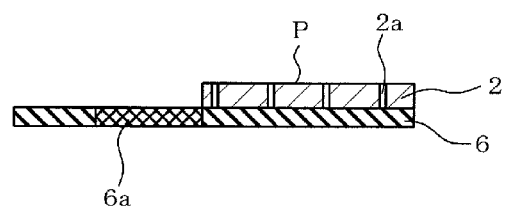
FIG. 10A is a schematic cross-sectional view of a detail of the semiconductor substrate at one step of the manufacturing process.
Figure 10B:
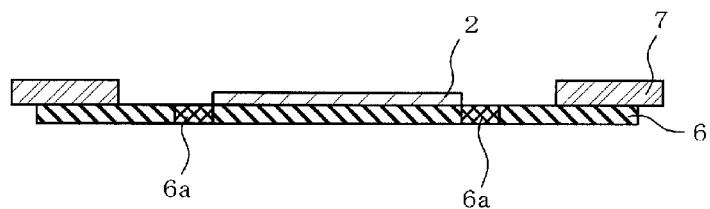
FIG. 10B is a schematic cross-sectional view of the semiconductor substrate at one step of the manufacturing process.

In FIG. 10A and FIG. 10B, the support substrate 4 is separated from the device portion 2 of the semiconductor substrate 1. As illustrated in FIG. 10A, the separation occurs between the cured portion 6a and the adhesion layer 5; between the cured portion 6a and the device portion 2; and between the device portion 2 and the peel-off layer 3. A portion of the device portion 2 having a diameter greater than the outermost dicing groove 2a is also separated from the device portion 2 and the tape 6.

As a result, the portion of the device portion 2 which is attached to the inner peripheral portion of the cured portion 6a of the tape 6 may be peeled off during the separation of the support substrate 4. The device portion 2 of the semiconductor substrate 1 remains attached to the tape 6, although the device portion 2 has been diced into individual chips.

In the second embodiment, since the dicing is carried out before attaching the tape 6, when the support substrate 4 is separated from chips P of the device portion 2, the chips P adhere to the tape 6 and are reliably secured.

Figure 11A:
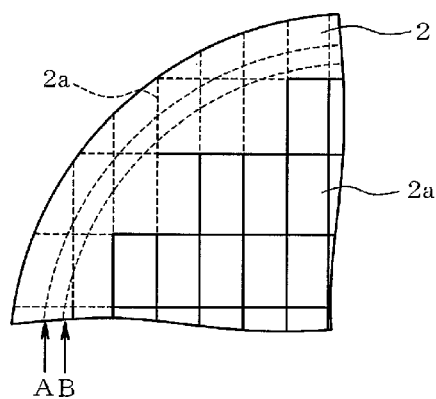
FIG. 11A is a schematic plan view of a detail of a semiconductor substrate illustrating an irradiation range of a laser beam.
Figure 11B:
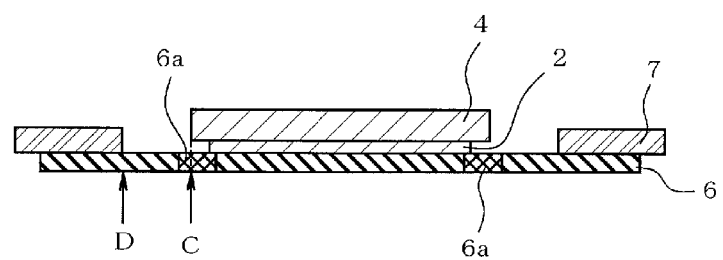
FIG. 11B is a schematic cross-sectional view of the semiconductor substrate illustrating an irradiation range of a laser beam.

FIG. 11A to FIG. 12B describe a relationship between a position of the dicing groove 2a and a UV irradiation range. FIG. 11A illustrates the position of the dicing groove 2a with respect to the device portion 2 of the semiconductor substrate 1. The dicing groove 2a provides grooves in the x and y directions and divides the device portion 2 of the semiconductor substrate 1 into the rectangular-shaped chips P (pictured in FIG. 10A). In FIG. 11A, the solid lines serve to outline chips P that result after the dicing step. The dotted lines indicate inactive areas.

With respect to the planar pattern as described above, the position of the cured portion 6a, which is irradiated with the UV laser beam, may fall within a particular range. The inner diameter of a ring-shaped region of the UV laser irradiation is $R_I$, and the outer diameter thereof is $R_O$. The position of the inner diameter $R_I$ may be in the range between a position A and a position B, illustrated in FIG. 11A, where position A is the outer diameter of the peel-off layer 3, and position B is the outer diameter of the dicing groove 2a of the available chips P. Additionally, the position of the outer diameter $R_O$ may be in the range between a position C and a position D, illustrated in FIG. 11B, where position C is approximately equal to the outermost diameter of the support substrate 4 (which is greater than the outermost diameter at which the adhesion layer 5 contacts the tape 6), and position D is equal to the inner diameter of the ring frame 7.

Figure 12A:
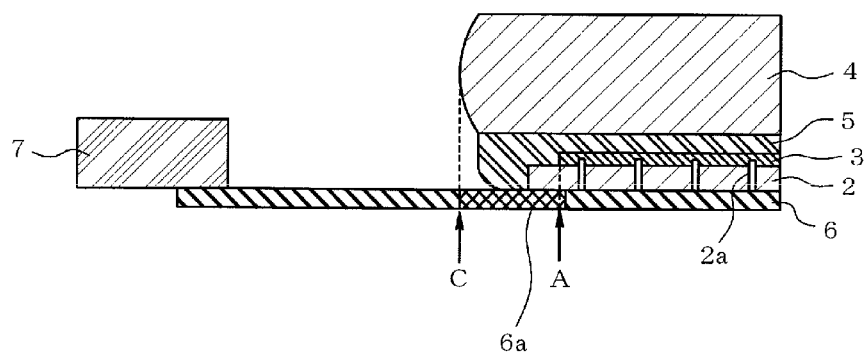
FIG. 12A and FIG. 12B are schematic plan views of a detail of a semiconductor substrate illustrating the irradiation range of the laser beam.

As a result, as illustrated in FIG. 12A, the minimum UV laser irradiation range which is necessary to separate the support substrate 4 from the device portion 2, is a range 6a from the outer diameter C to the inner diameter A described above. The outer diameter C is preferable if it reflects the diameter at which the tape 6 and the adhesion layer 5 adhere to each other, but the outer peripheral position of the adhesion layer 5 is not necessarily at the position shown in FIG. 12A. However, if the position of the adhesion layer 5 is reliably measured, the position may be used as a reference.

Figure 12B:
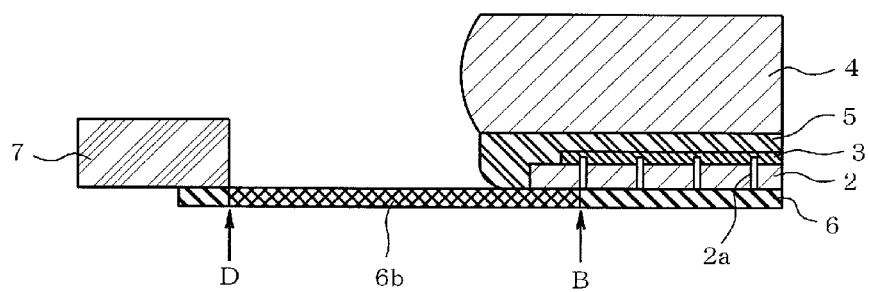

On the other hand, as illustrated in FIG. 12B, the maximum UV laser irradiation range which may be necessary to separate the support substrate 4 is a range 6b from the outer diameter D to the inner diameter B described above.

In a cleaning process of the peel-off layer 3 after peeling off the support substrate 4, since the adhesive layer of the tape 6 is cured, it is possible to remove the non-cured components in the adhesive layer from the chips P by eluting the non-cure components into a cleaning solvent. Depending on the degrees of the elution into the cleaning solvent of the adhesive layer of the tape 6, it may not be necessary to irradiate the whole of the exposed tape 6 with the UV laser beam, and it is sufficient to irradiate only the needed portions with the UV laser beam. Moreover, in the second embodiment, a portion of the tape 6 under the ring frame 7 is not irradiated with the UV laser beam so that the tape 6 remains attached to the ring frame 7. However, the adhesion property between the ring frame 7 and the tape 6 is strong even after UV laser irradiation, and the tape 6 which is positioned under the ring frame 7 may be irradiated with the UV laser beam without resulting in the tape 6 peeling away from the ring frame 7.

The second embodiment may achieve the same operational effects as the first embodiment. Moreover, because the tape 6 is attached after the dicing of the device portion 2, the chips P in the inactive area are cracked during peeling off the support substrate 4, but it is possible to reliably prevent the spread of the cracking from reaching the chips P of the effective area.

In the second embodiment, the depth of the dicing is recommended to reach the middle of the peel-off layer 3. However, the depth may reach only the border between the device portion 2 and the peel-off layer 3. Alternatively, the depth may reach into the peel-off layer 3, or the depth may reach as far as the adhesion layer 5.

(Third Embodiment)

Figure 13:
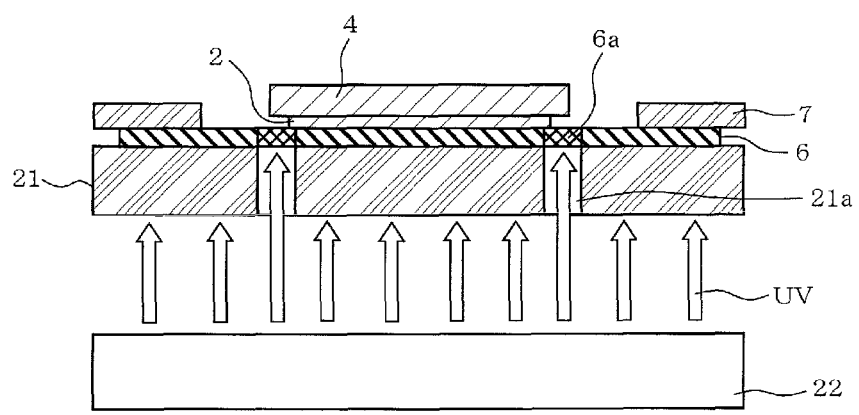
FIG. 13 is a schematic cross-sectional view of a UV irradiation apparatus according to a third embodiment.

FIG. 13 illustrates a third embodiment that employs a different UV irradiation apparatus from that which is used in the first and second embodiments. A UV irradiation apparatus 20 performs the UV irradiation in the state where the tape 6 is attached onto the first surface of the device portion 2 while the second surface of the semiconductor substrate 1 is bonded to the support substrate 4, and where the tape 6 is retained by the ring frame 7.

A table 21, on which the ring frame 7 and the tape 6 are mounted, is a disk-shaped table comprising a material having light-shielding properties except for a light-transmitting portion 21a. The light-transmitting portion 21a of the table 21 is provided in the ring shape, corresponding to the cured portion 6a, which is the UV-irradiated portion of the tape 6. A UV lamp 22 is provided on the side of the table 21 facing the tape 6. The UV lamp 22 has a light-emitting face corresponding to substantially the entire face of the table 21, and directs UV rays toward the table 21.

As a result, the UV rays from the UV lamp 22 pass through the light-transmitting portion 21a of the table 21, irradiating the tape 6 in the ring shape to form the cured portion 6a. Because many of the UV rays will be light-shielded by the table 21, it is possible to selectively direct the UV irradiation onto only the light-transmitting portion 21a of the table 21.

Therefore, the third embodiment may achieve the same operational effects as the first embodiment. Moreover, because the entire cured portion 6a is UV-irradiated at one time, the ring-shaped cured portion 6a may be formed on the tape 6 in a short time. Additionally, because no rotating mechanism is necessary, the UV irradiation apparatus 20 may be simply configured.

(Other Embodiments)

The embodiments described herein may be subject to the following modifications.

The first substrate and the second substrate are described as the semiconductor substrate 1 and the support substrate 4, but the first substrate and the second substrate are not limited thereto. The embodiment applies to the separation of any two sheets of substrates bonded to each other by an adhesion layer.

The UV irradiation methods provided include performing the irradiation with the laser beam from the laser irradiation portion 13 while rotating the table 11, or irradiating the table 21 through the light-transmitting portion 21a with the UV rays from the UV lamp 22 while the table 21 is stationary. However, the methods of irradiation are not limited thereto, and it is possible to perform the irradiation in various types of methods. For example, the UV laser beam may be reflected by a mirror, and the configuration of irradiating a predetermined range of the tape 6 may be achieved by changing a reflection angle of the mirror, or moving the mirror.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device on a first substrate having a first surface and a second surface, comprising:
    disposing a peel-off layer on the second surface of the first substrate, wherein the second surface of the first substrate comprises semiconductor integrated circuits, and the peel-off layer does not extend to an outer peripheral portion of the second surface of the first substrate;
    bonding a second substrate to the peel-off layer via a bonding layer;
    grinding the first substrate to have a thickness of 50 μm or less;
    attaching a tape onto the first surface of the first substrate, wherein the tape comprises an adhesive agent having an adhesive strength capable of being lowered by UV irradiation;
    irradiating a portion of the adhesive agent adhering at least to an outer peripheral portion of the first surface of the first substrate with UV rays directed toward the first surface;
    separating a stack of the second substrate, the bonding layer, and the peel-off layer from a surface of the portion of the adhesive agent and the second surface of the first substrate; and
    prior to bonding the second substrate to the peel-off layer via the bonding layer, and after forming the semiconductor integrated circuits, removing a part of the outer peripheral portion of the second surface of the first substrate up to a predetermined depth.

2. The method according to claim 1, wherein after the separating, the first surface of the first substrate remains attached to the tape.

3. The method according to claim 1,
wherein the irradiating of the portion of the adhesive agent comprises directing the UV rays toward a portion of the tape from a surface of the tape that is opposite to a surface of the tape facing the first substrate, wherein the portion of the tape extends at least from a position corresponding to an outer edge of the peel-off layer to a position corresponding to an outer edge of the bonding layer in a surface direction of the tape.

4. The method according to claim 1, further comprising:
    prior to attaching the tape onto the first surface of the first substrate, dicing the first substrate to form a plurality of chips.

5. The method according to claim 1, wherein in the irradiating of the portion of the adhesive agent with the UV rays directed toward the first surface, the outer peripheral portion of the first surface of the first substrate is also irradiated with the UV rays.

6. A method of manufacturing a semiconductor device, comprising:
    disposing a peel-off layer on a central portion of a second surface of a first substrate, wherein a device layer is formed on the central portion of the second surface, and the peel-off layer is not disposed on an outer peripheral portion of the second surface surrounding the central portion;
    bonding a second substrate to the peel-off layer using a bonding layer, the bonding layer directly contacting the outer peripheral portion of the second surface;
    grinding the first substrate to have a thickness of 50 μm or less;
    attaching a tape to a first surface of the first substrate that is opposite the second surface, the tape having an adhesive agent having adhesive strength that is capable of being lowered by UV irradiation;
    irradiating a portion of the tape that is attached to an outer peripheral portion of the first surface of the first substrate with UV light provided from a surface of the tape not facing the first substrate;
    separating the second substrate, the bonding layer, and the peel-off layer from the tape and the second surface of the first substrate; and
    prior to bonding the second substrate to the peel-off layer via the bonding layer, and after forming the device layer, removing a part of the outer peripheral portion of the second surface of the first substrate up to a predetermined depth.

7. The method of claim 6, wherein the peel-off layer is disposed only on the central portion of the second surface and does not extend to an outer peripheral edge of the device layer.

8. The method of claim 6, wherein, after attaching the tape, the bonding layer directly contacts the tape and an outer peripheral edge of the first substrate, the outer peripheral edge being a side surface of the first substrate extending between the first and second surfaces of the first substrate.

9. The method of claim 6, wherein the grinding of the first substrate occurs prior to the attaching of the tape to the first surface of the first substrate.

10. The method according to claim 1, wherein the grinding of the first substrate occurs prior to the attaching of the tape to the first surface of the first substrate.

* * * * *